United States Patent [19]
Tashiro

[11] Patent Number: 5,366,921
[45] Date of Patent: Nov. 22, 1994

[54] PROCESS FOR FABRICATING AN ELECTRONIC CIRCUIT APPARATUS

[75] Inventor: Kazuaki Tashiro, Yokohama, Japan

[73] Assignee: Canon Kabushiki Kaisha, Tokyo, Japan

[21] Appl. No.: 171,764

[22] Filed: Dec. 22, 1993

Related U.S. Application Data

[63] Continuation of Ser. No. 829,624, Jan. 31, 1992, abandoned, which is a continuation of Ser. No. 483,310, Feb. 21, 1990, abandoned, which is a continuation of Ser. No. 265,569, Nov. 1, 1988, abandoned.

[30] Foreign Application Priority Data

Nov. 13, 1987 [JP] Japan .................. 62-285619

[51] Int. Cl.$^5$ ............................ H01L 21/70
[52] U.S. Cl. ............................ 437/56; 437/4; 437/54; 437/241; 148/DIG. 1; 148/DIG. 14
[58] Field of Search ............ 437/56, 2, 3, 4, 979, 437/241; 148/DIG. 114

[56] References Cited

U.S. PATENT DOCUMENTS

| | | |
|---|---|---|
| 4,396,934 | 8/1983 | Nishida et al. . |
| 4,405,915 | 9/1983 | Komatsu et al. . |
| 4,461,956 | 7/1984 | Hatanaka et al. . |
| 4,472,730 | 9/1984 | Ohta . |
| 4,532,536 | 7/1985 | Hatanaka et al. . |
| 4,636,450 | 1/1987 | Ogawa et al. . |
| 4,650,984 | 3/1987 | Furushima et al. . |
| 4,667,214 | 5/1987 | Sekimura et al. . |
| 4,913,661 | 6/1990 | Fukaya et al. . |
| 4,997,773 | 3/1991 | Nobue et al. .................. 437/2 |

FOREIGN PATENT DOCUMENTS

| | | | |
|---|---|---|---|
| 0232083 | 8/1987 | European Pat. Off. ........ 437/3 |
| 0138964 | 10/1981 | Japan ............................ 437/2 |
| 0138966 | 10/1981 | Japan ............................ 437/2 |

OTHER PUBLICATIONS

Sze, *Semiconductor Devices: Physics and Tech.*, 1985, pp. 360–361, 472, 474–475.

Primary Examiner—Tom Thomas
Assistant Examiner—Michael Trinh
Attorney, Agent, or Firm—Fitzpatrick, Cella, Harper & Scinto

[57] ABSTRACT

An electronic circuit apparatus which is constructed by laminating a plurality of thin films onto an insulative substrate. On the substrate, an electronic circuit element having two conductive layer which are laminated through an insulative layer is formed. The insulative layer is formed so as to cover the whole surface of the insulative substrate.

4 Claims, 6 Drawing Sheets

PROCESS FOR FABRICATING AN ELECTRONIC CIRCUIT APPARATUS

This application is a continuation of application Ser. No. 07/829,624 filed Jan. 31, 1992, abandoned which is a continuation of application Ser. No. 07/483,310 filed Feb. 21, 1990, abandoned, which is a continuation of Ser. No. 07/265,569 filed Nov. 1, 1988, abandoned.

BACKGROUND OF THE INVENTION

1. Field of the Invention

The present invent ion relates to an electronic circuit apparatus and, more particularly, to an electronic circuit apparatus which is formed by laminating a plurality of thin films onto an insulative substrate, and in which an electronic circuit device having two conductive layers which are laminated through an insulative layer is formed.

The invention is preferably used in an image reading apparatus for reading image information such as a character and graph provided in an information processing device of a facsimile or image scanner.

2. Related Background Art

In recent years, a long-shaped contact type image reading apparatus having an equal magnification optical system has been developed to realize the miniaturization and high performance of a facsimile, an image reader, or the like. Hitherto, such an image reading apparatus has been constructed such that signal processing ICs (integrated circuits) each consisting of a switching element and the like are connected to respective photoelectric converting elements arranged in an array of one line.

However, for the number of photoelectric converting elements, 8 elements per 1 mm, for example, 1728 elements for A4 size are necessary in accordance with the G3 standard of the facsimile, and a number of signal processing ICs are needed. Therefore, the number of installing steps increases and a satisfactory apparatus is not yet obtained in terms of the manufacturing cost and reliability.

On the other hand, as a construction to reduce the number of signal processing ICs and to reduce the number of installing steps, a construction of the matrix wiring connection has conventionally been used.

On the other hand, there has also been performed an experiment to cheaply provide an image reading apparatus in which a thin film transistor was used as a switching element and an integrated structure consisting of a photoelectric converting section, a thin film transistor section, a matrix wiring section, and the like are used, thereby reducing the function of the signal processing IC and obtaining a high reading speed.

To provide an image reading apparatus in which the manufacturing cost is further reduced and the reliability is high, there has also been developed a method whereby a photoelectric converting layer in a photoelectric converting section and a semiconductor layer in a thin film transistor section are formed by the same material of amorphous silicon, and the photoelectric converting section, thin film transistor section, matrix wiring section, and the like are integrally formed on the same substrate by use of the same manufacturing process.

Such conventional examples of image reading apparatuses are shown in FIGS. 1(A), 1(B), 1(C), and 2.

Figure 1A:
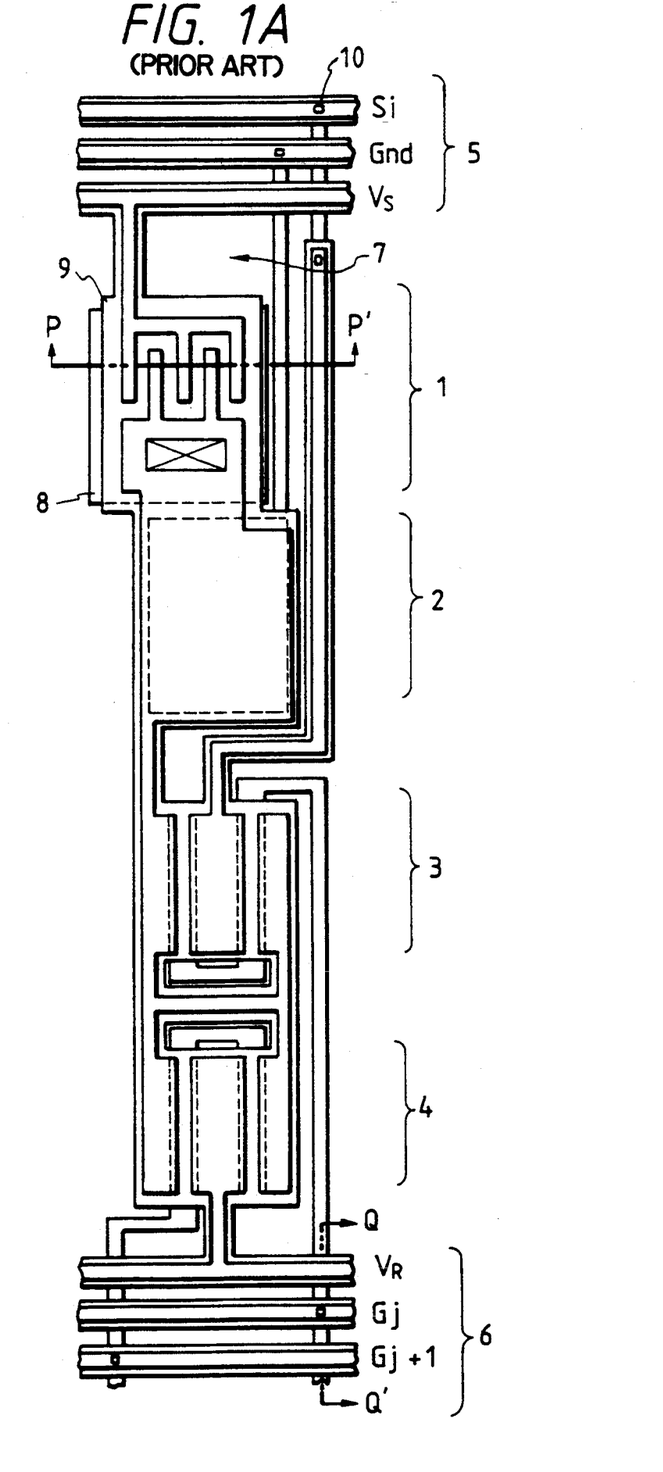
FIGS. 1(A), 1(B), and 1(C) are explanatory diagrams showing an example of a construction of a conventional image reading apparatus.

FIG. 1(A) is a schematic plan view showing one of 1728 sets each comprising a photoelectric converting section, a capacitor section, a thin film transistor section, and a matrix wiring section and showing a corresponding one of 1728 pixels arranged in the longitudinal direction.

Figure 1B:
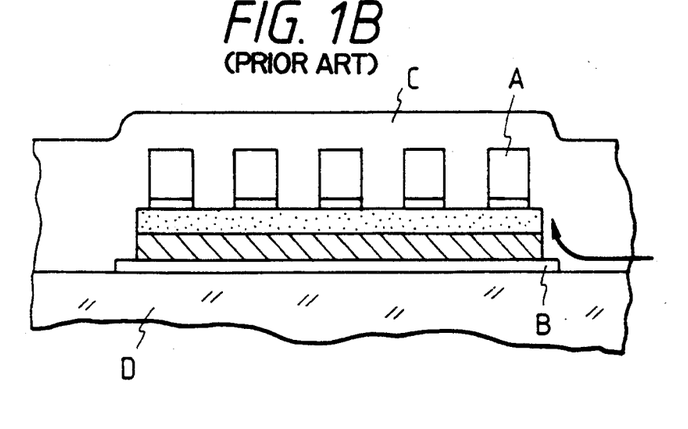
Figure 1C:
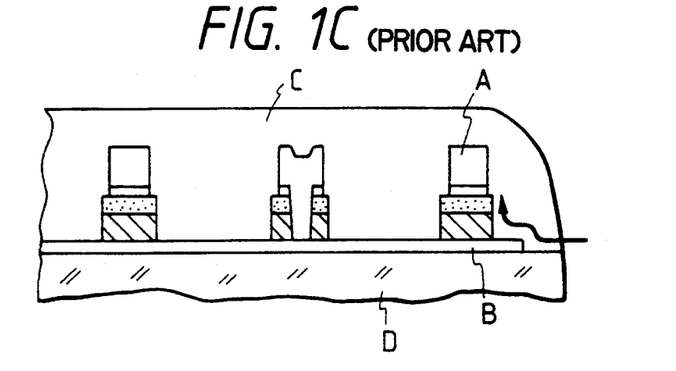

FIGS. 1(B) and 1(C) are vertical sectional views taken along the line P—P' and Q—Q' in FIG. 1(A), respectively.

Figure 2:
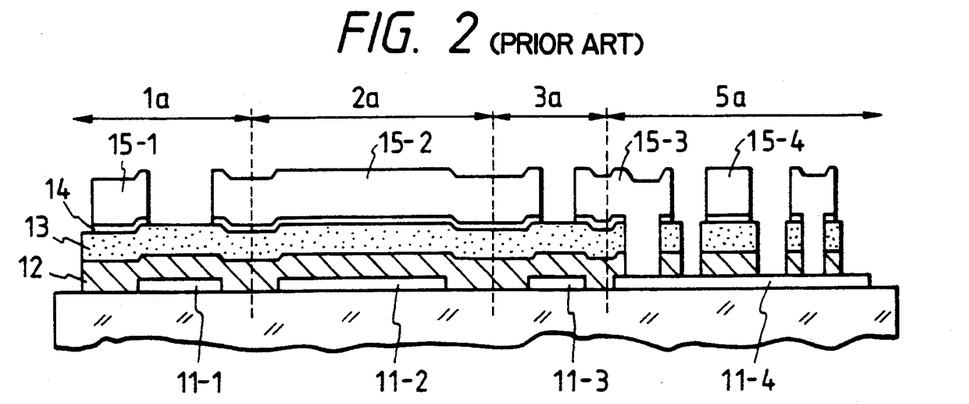
FIG. 2 is a cross sectional view of one pixel of the conventional image reading apparatus.

FIG. 2 is a cross sectional view of one pixel of the conventional image reading apparatus.

For easy understanding, FIG. 2 is diagrammatically illustrated in a simple form and there is no strict corresponding relation with FIG. 1(A).

In FIG. 1(A), a photoelectric converting section 1 has a lower electrode 8 also serving as a light shielding film for a light from the side of a substrate. The light irradiated from the substrate side passes through a light passing window 7 and is reflected by the surface of an original (not shown) at a position which is vertically located over the drawing. The scattered light enters the photoelectric converting section 1. A photo current induced by generated carriers flows through an accumulating capacitor section 2 and is accumulated. The accumulated charges are fed to a matrix wiring section 5 having signal lines by a thin film transistor section 3, and sent to a signal processing section (not shown).

A thin film transistor section 4 functions to discharge the charges remaining in the capacitor after the charges were transferred and to return the capacitor to an initial value.

In FIG. 2, a construction of the layer of each section will be briefly explained. In the diagram, reference numeral 1a denotes a photoelectric converting section; 2a is an accumulating capacitor section; 3a is a thin film transistor section; and 5a is a matrix wiring section. These sections have a common layer structure of five layers comprising: first conductive layers 11-1, 11-2, 11-3, and 11-4; an amorphous silicon nitride layer 12; an amorphous silicon layer 13; an n+ amorphous silicon layer 14 for ohmic contact; and a second conductive layer 15.

On the other hand, in the case of manufacturing such an image reading apparatus, when a semiconductor layer exists between respective pixels, a crosstalk occurs due to a leakage current and it is difficult to accurately read an image. Therefore, the elements are separated by etching or the like during the manufacturing processes, thereby eliminating the unnecessary conductor together with the insulative layers.

However, such an image reading apparatus in which the elements are separated has the following problems.

When the conventional image reading apparatus is subjected to durability tests of high temperatures and high humidity, a phenomenon such that the wiring is short-circuited occurs. This phenomenon will be described with reference to FIGS. 1(B) and 1(C). Many short-circuited portions appear in the photoelectric converting section in FIG. 1(A) and in the matrix wiring section in FIG. 1(B). In these structures, a high electric field (potential difference of a few V to tens of V) is applied between an upper electrode A and a lower electrode B. When the apparatus is subjected to the durability tests of high temperatures and high humidity in this state, an electrochemical reaction occurs between the electrodes A and B through a water component and ions (indicated by arrows in the diagram) which enter from the outside through an interface between a passivation film C made of, for example, polyimide or the like and a substrate D made of, for example, glass or the like. A corrosion of the electrodes in these portions progresses and this results in the short-circuit between the electrodes A and B. Those problems are ones concerned with the contact type photoelectric conversion apparatus comprising an electric circuit and directly contacting an original containing moisture, and should be solved.

SUMMARY OF THE INVENTION

It is an object of the present invention to provide an electronic circuit apparatus which can improve the deterioration in insulation between conductive layers and has a high reliability in an electronic circuit apparatus, as in the foregoing conventional image reading apparatus, which is constructed by laminating a plurality of thin films on an insulative substrate and on which an electronic circuit device having two conductive layers which are laminated through an insulative layer is formed.

Another object of the present invention is to provide an electronic circuit apparatus which is constructed by laminating a plurality of thin films on an insulative substrate and on which an electronic circuit device having two conductive layers which are laminated through an insulative layer is formed, wherein the insulative layer is formed so as to cover the whole insulative substrate.

Still another object of the present invention is to provide an electronic circuit apparatus constructed by laminating a plurality of thin films onto an insulative substrate, an electronic circuit device has having two conductive layers which are laminated through an insulative layer, and the whole insulative substrate is covered by using the insulative layer of the electronic circuit device; therefore, at least one of the two conductive layers is completely covered by the insulative layer, and the influence of the water component, ions, and the like which enter from the outside is prevented, and the electrochemical reaction between the conductive layers can be prevented.

DETAILED DESCRIPTION OF THE PREFERRED EMBODIMENT

An embodiment of the present invention will be described in detail hereinbelow with reference to the drawings.

An image reading apparatus will be described hereinbelow as an example of an electronic circuit apparatus according to the invention; however, the invention is not limited to this apparatus.

Figure 3A:
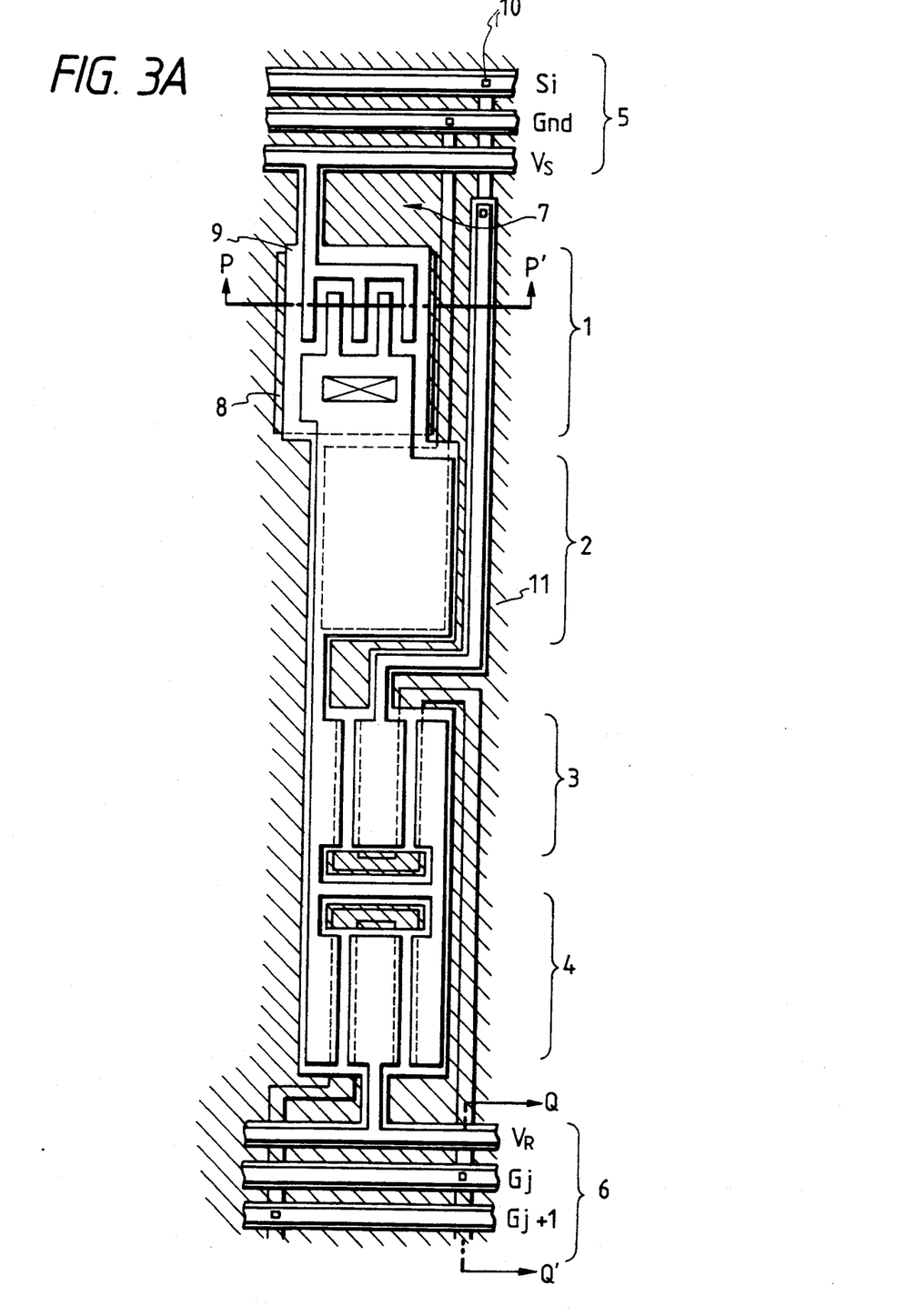
FIG. 3(A) is a plan view showing an example of a construction of an image reading apparatus according to one embodiment of the present invention.
Figure 3B:
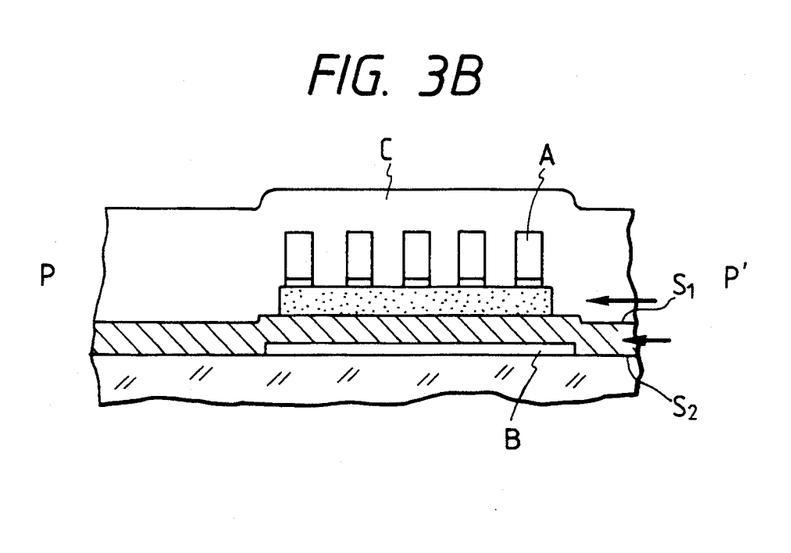
FIGS. 3(B) and 3(C) are vertical sectional views taken along the lines P—P' and Q—Q' in FIG. 3(A), respectively.
Figure 3C:
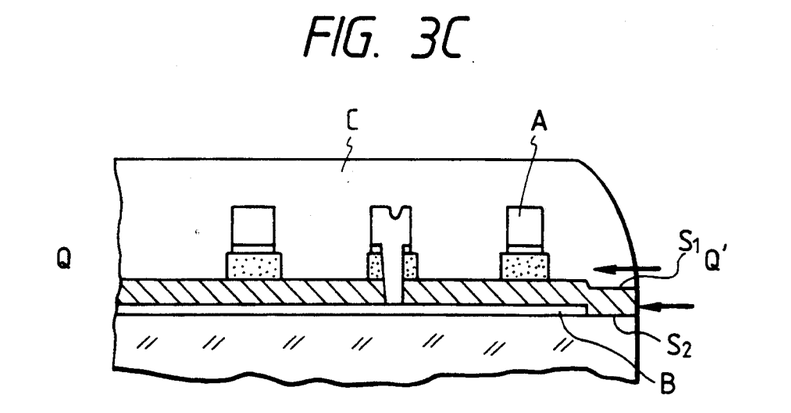

FIG. 3 is a schematic diagram showing an example of a structure of the most advantageous image reading apparatus among ones according to the invention. FIG. 3(A) is a plan view corresponding to one pixel of the image reading apparatus in which a photoelectric converting section as a photoelectric conversion element, an accumulating capacitor section, a thin film transistor transfer section, a thin film transistor reset section, and a matrix wiring section for reading signals from the photoelectric-conversion element are formed on the same substrate. FIGS. 3(B) and 3(C) are vertical sectional views taken along the lines P—P' and Q—Q' in FIG. 3(A), respectively. A structure including only the storage capacitor and the thin film transistor is referred to as the photoelectric conversion element.

In FIG. 3(A), reference numeral 1 denotes the photoelectric converting section; 2 is the accumulating capacitor section to temporarily accumulate the charges which are supplied by a photo current generated in the photoelectric converting section 1; 3 is the transferring thin film transistor section to transfer the charges stored in the capacitor section 3; 4 is the resetting thin film transistor section to initialize the device by discharging the charges remaining in the capacitor section after the charges were transferred; 5 is the matrix wiring section for signal lines which receives a signal from the transferring thin film transistor section 3; 6 a matrix wiring section of a gate line to drive the thin film transistor; 7 is the light passing window to lead the light irradiated by the back surface of the substrate to an original; 8 is the lower electrode section also serving as a light shielding film of the photoelectric converting section 1; 9 is a pattern shape portion of a semiconductor layer after isolation of elements; 10 is a contact hole; and 11 ( hatched region ) a portion of an insulative layer which is left when the elements are separated and is a characteristic feature of the present invention.

The operation of one pixel of the image reading apparatus with the above structure will now be described hereinbelow.

Figure 4A:
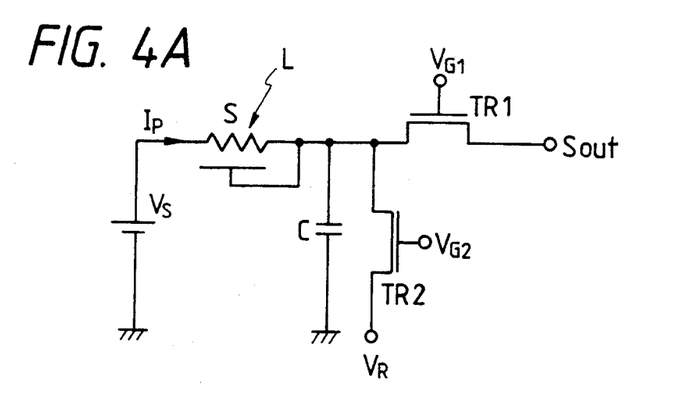
FIGS. 4(A) and 4(B) are an equivalent circuit diagram of one pixel of the image reading apparatus and a timing chart thereof.

FIG. 4(A) is an equivalent circuit diagram of one pixel of the image reading apparatus.

Figure 4B:
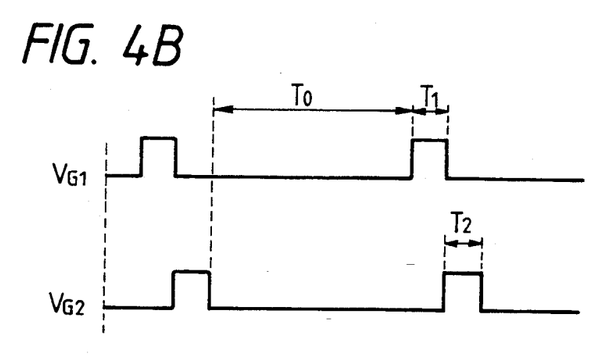

FIG. 4(B) is a timing chart for explaining the operation of this apparatus.

As shown in FIGS. 4(A) and 4(B), a bias voltage $V_s$ is always applied to a photoelectric converting section S. When a light L enters this section, a photo current $I_p$ flows. At this time, thin film transistors $TR_1$ and $TR_2$ are in the off state. The photo current $I_p$ flows for a predetermined time $T_O$ and is chargerd into an accumulating capacitor C. After the elapse of the time $T_O$, a gate voltage $VG_1$ is applied to the transferring thin film transistor $TR_1$ for a predetermined period of time $T_1$, so that the $TR_1$ is turned on. The charges stored in the capacitor C are transferred to an output $S_{out}$ and processed by a signal processing circuit (not shown). After the elapse of the time $T_1$, the $TR_1$ is again turned off and, at the same time, a gate voltage $VG_2$ is applied to the resetting thin film transistor $TR_2$ for a predetermined period of time $T_2$. The charges remaining after the charges were transferred are discharged to thereby initialize the capacitor C. Then, the charging into the storage capacitor C in the second cycle is started as a next reading operation and the similar operations are repeated.

The operation of one pixel is as explained above. In the actual image reading apparatus, each pixel is divided into a plurality of blocks and by repeating the foregoing operations for every block, data of one line is read out.

EXAMPLE

A method of manufacturing the image reading apparatus shown in FIGS. 3(A), 3(B), and 3(C) will now be described.

FIGS. 5(A) to 5(E) are schematic diagrams for explaining the manufacturing steps of the image reading apparatus according to the present invention.

The cross sectional shape in these diagrams is diagrammatically illustrated for easily understanding the manufacturing steps, and the arrangement and the like of the element sections do not directly correspond to FIG. 3. However, the manufacturing steps themselves are the same as those shown in FIG. 5.

First, the glass substrate (#7059 made by Corning Glass Works Co., Ltd.) whose both sides had been polished was subjected to the ordinary cleaning by using a neutral detergent (organic alkali system detergent may be used). Next, Cr was deposited by an electron beam evaporation method so as to have a thickness of 0.1 μm. A photo resist pattern of a desired shape was formed by using a positive type photo resist (AZ-1370 made by Siprey Co., Ltd.). Unnecessary Cr was eliminated by using a mixed aqueous solution of nitric acid secondary cerium ammonium and perchloric acid. The lower layer electrode 11-1 of the photoelectric converting section 1a, the lower layer electrode 11-2 of the capacitor section 2a, the gate electrode 11-3 of the thin film transistor section 3a, and the lower layer electrode 11-4 of the matrix wiring section 5a were formed (FIG. 5(A)).

Next, the glass substrate Sub was set in a capacitive coupling type glow discharge resolving apparatus and maintained at 230° C. in the vacuum of $1 \times 10^{-6}$ Torr. Then, SiH$_4$ diluted to 10% by H$_2$ was supplied into the apparatus at a flow rate of 5 SCCM. At the same time, NH$_3$ was also supplied into the apparatus at a flow rate of 20 SCCM. The glow discharge was performed for two hours at an RF discharge electric power of 15 W by using a high frequency power source of 13.56 MHz and the insulative layer 12 consisting of silicon nitride was formed so as to have a thickness of 0.3 μm. Next, the SiH$_4$ gas was supplied into the apparatus at a flow rate of 10 SCCM and the glow discharge was executed for 2.5 hours by using a discharge electric power of 8 W at a gas pressure of 0.7 Torr. Thus, amorphous silicon intrinsic layer 13 was formed so as to have a thickness of 0.50 μm. Subsequently, the n layer 14 serving as an ohmic contact layer was deposited by a discharge electric power of 30 W so as to have a thickness of 0.12 μm by using the gases, as a raw material, in which SiH$_4$ diluted to 10% by H$_2$ and PH$_3$ diluted to 100 ppm by H$_2$ had been mixed at a mixture ratio of 1:10 (FIG. 5(B)).

Next, a pattern of contact holes was formed by using a positive type photo resist (OFPR-1300 made by Tokyo Ohyo Kagaku Co., Ltd. ). A dry etching was performed by using the CF$_4$ gas with an RF discharge electric power of 100 W and at a gas pressure of 0.30 Torr by a plasma etching method to eliminate the unnecessary portions of the n$^+$ layer and the amorphous silicon intrinsic layer. Thus, the contact holes 10 were formed. (FIG. 5(C)).

Next , Al was deposited so as to have a thickness of 0.5 μm by an electron beam evaporation method to thereby form a conductive layer. A photo resist pattern of a desired shape was subsequently formed. Thereafter, a conductive layer of the exposed portion was eliminated by using a mixture liquid in which phosphoric acid (aqueous solution of 85 volume %) , nitric acid (aqueous solution of 60 volume %), glacial acetic acid, and water had been mixed at a volume ratio of 16:1:2:1, thereby forming upper electrodes 15-1, 15-2, 15-3, and 15-4 . After that, the n$^+$ layer in the exposed portion was eliminated by performing the dry etching by using the CF$_4$ gas by the plasma etching method mentioned above, thereby forming a desired n layer. Then, the photo resist was peeled off (FIG. 5(D)).

Next, a photo resist pattern was formed to separate elements. Construction as a most characteristic insulating means of the present invention are embodied by the following steps.

Only the intrinsic semiconductor layer was eliminated by an etching by using the element separating pattern as a mask. And the silicon nitride film is retained. In this case, by controlling the etching time by using the CF$_4$ gas as a reaction gas on the basis of the plasma etching method, the intrinsic semiconductor layer of 6000 Å and silicon nitride film of about 500 Å were etched. The silicon nitride film of about 2500 Å was left on most of the surfaces between elements so that substrate surface is not exposed.

Figure 5A:
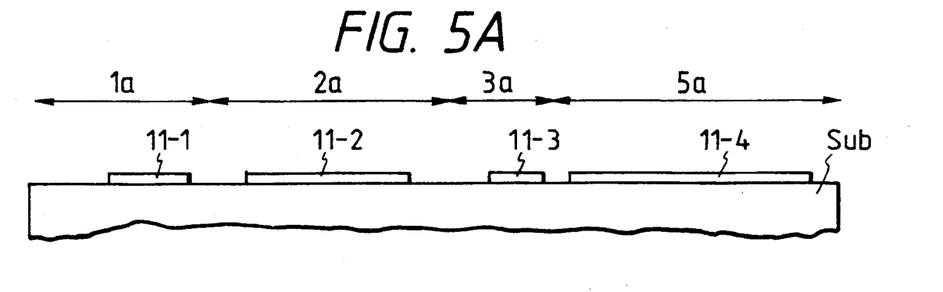
FIGS. 5(A) to 5(E) are step diagrams for explaining manufacturing steps of the image reading apparatus.
Figure 5B:
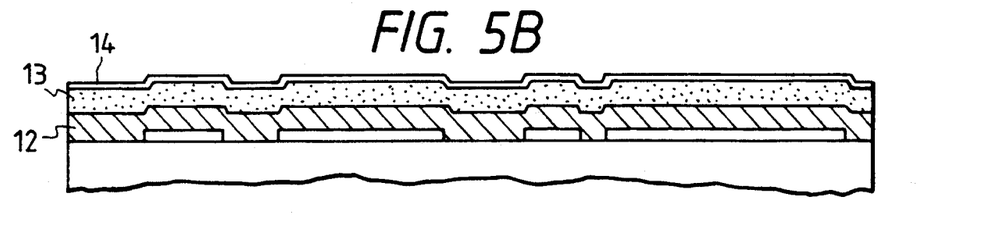
Figure 5C:
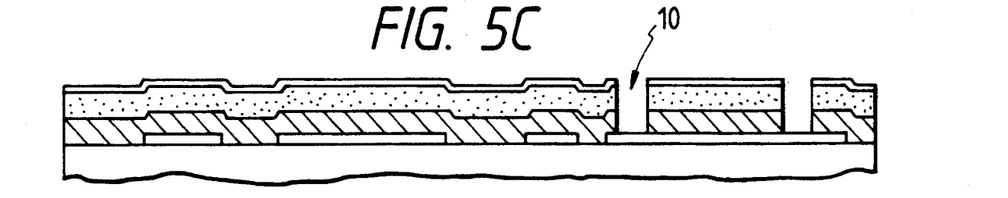
Figure 5D:
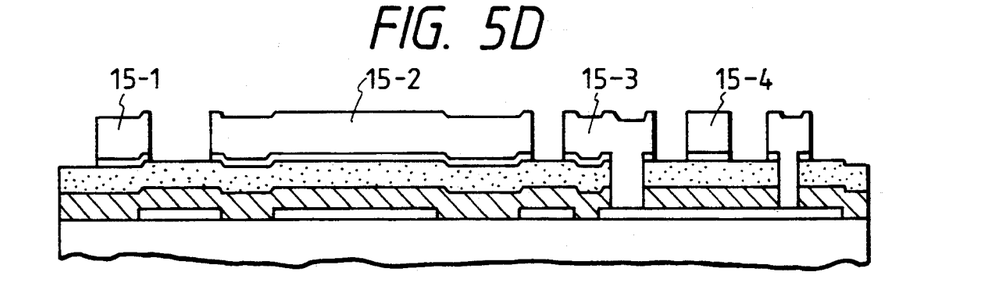
Figure 5E:
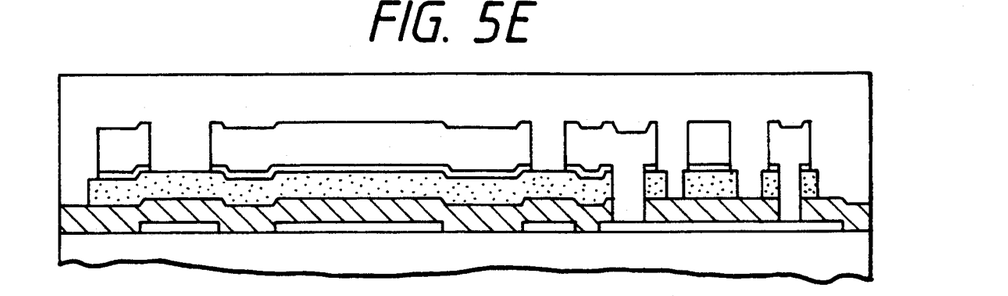

Finally, a passivation film was formed by using a polyimide film or the like (FIG. 5(E)).

Subjecting the image reading apparatus having the foregoing structure to the tests of high temperatures and high humidity reveals that occurrence of an improper operation is reduced.

As shown in FIGS. 3(B) and 3(C), the water component and ions and the like can easily enter from the outside through an interface S$_1$ between the passivation film C and the silicon nitride film and through an interface S$_2$ between the silicon nitride film and the insulative substrate at high temperatures and high humidity (indicated by arrows in the diagram). However, the movement of the water component, ions, and the like between the upper electrode A and the lower electrode B is blocked by the silicon nitride film existing therebetween. Even if a high electric field was applied between the upper and lower electrodes A and B, the electrochemical reaction through the water component, ions, and the like cannot occur, so that a corrosion of both of the upper and lower electrodes and, further, a short-circuit failure do not occur, either.

In this embodiment, since the same manufacturing process of the same layer structure has been used as the manufacturing method, the invention can be realized by slightly changing the etching process to separate the elements without needing any special complicated manufacturing steps. Consequently, the invention is also advantageous in terms of the reduction of the manufacturing costs and the improvement of the manufacturing yield.

Further, retaining the insulative film at a thickness of about 2500 Å is most desirable, thereby the flatness of the elements is improved by only the amount of this thickness. A coverage property of the passivation film is improved. The improvement of the yield can be also expected with respect to these points. In particular, in the case of using a thin film of amorphous silicon nitride or the like as the passivation film, the yield is influenced by the degree of coverage. Therefore, this advantage of the invention is effective.

Figure 6:
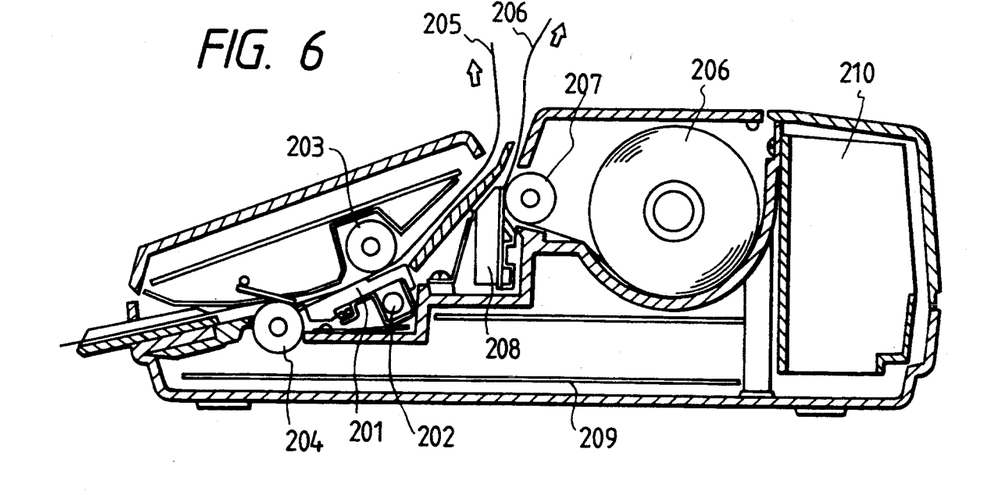
FIG. 6 is a schematic arrangement diagram of a facsimile apparatus using the embodiment.

FIG. 6 is a schematic constructional diagram of a facsimile apparatus as an information processing apparatus using the image reading apparatus according to the present invention.

In the diagram, when an original is transmitted, an original 205 is pressed onto a contact type image sensor 201 by a platen roller 203 and moved in the direction indicated by an arrow, by the platen roller 203 and a feed roller 204. The surface of the original is illuminated by a xenon lamp 202 as a light source. The reflected light enters the sensor 201 as the image reading apparatus and is converted into the electric signal corresponding to image data of the original, and is transmitted.

Upon reception, a recording paper 206 is conveyed by a platen roller 207 and the image corresponding to the reception signal is reproduced by a thermal head 208.

The whole apparatus is controlled by a controller provided on a system control substrate 209. An electric power is supplied from a power supply 210 to each drive system and each circuit.

Moisture within such information processing apparatus would be increased due to the moisture included in the original, in the head of the thermal head, and due to other weathering conditions. By applying the image reading apparatus of the present invention, under any environmental conditions, the reliability such as weatherability, life, and the like can be improved.

As described in detail above, according to the electronic circuit apparatus of the present invention, the movement of the water component, ions, and the like which enter from the outside is blocked between the conductive layers applied with a high electric field, so that the following advantages are provided.

(1) Even under circumstances of high temperatures and high humidity, the electrochemical corrosion of the upper or lower electrode does not occur and no short-circuit between the electrodes occurs. A high quality and stable electronic circuit apparatus can be provided. The yield is improved.

(2) On the other hand, the step to separate elements among the manufacturing steps is slightly simplified. The insulative layer can be effectively used. The manufacturing costs can be reduced.

What is claimed is:

1. A process for fabricating an electronic circuit apparatus comprising:

a substrate having an insulating surface, a plurality of electronic circuit elements disposed on said substrate, each of said electronic circuit elements having a thin film transistor provided with a gate electrode, a gate insulating layer, a semiconductor active layer, a source electrode and a drain electrode, each of said electronic circuit elements further having a capacitor, wherein said capacitor and said thin film transistor of each circuit element have a common semiconductor layer;

a wiring unit electrically connected with respective electronic circuit elements and disposed on said substrate, said wiring unit having a plurality of lower wirings, an insulating layer, a semiconductor layer and a plurality of upper wirings; and a protective layer covering said plurality of electronic circuit elements and said wiring unit;

said process comprising the steps of:

forming said gate electrodes and said plurality of lower wirings on said substrate;

applying an insulating film with a first thickness over said gate electrodes and said plurality of lower wirings, said gate insulating layers and said insulating layer being made of said insulating film;

applying a semiconductor film on said insulating film, said semiconductor active layers and said semiconductor layer being made of said semiconductor film;

forming said source electrodes, said drain electrodes and said plurality of upper wirings, whereby said plurality of electronic circuit elements and said wiring unit are formed on said substrate;

isolating said electronic circuit elements, respectively, by means of a plasma etching, by removing a part of said semiconductor film and a part of said insulating film between adjacent electronic circuit elements, wherein a remaining part of said insulating film between adjacent electronic circuit elements remains, and the remaining part of said insulating film has a second thickness less than the first thickness; and applying said protective layer over said electronic circuit elements and said wiring unit, whereby said protective layer is in contact with the surface of said insulating film between adjacent electronic circuit elements and at an outer side of said plurality of electronic circuit elements.

2. A process according to claim 1, wherein said electronic circuit element is a photoelectric conversion element.

3. A process according to claim 1 wherein said insulating film is made of silicon nitride.

4. A process according to claim 1, wherein said semiconductor film is made of amorphous silicon.

* * * * *

UNITED STATES PATENT AND TRADEMARK OFFICE
CERTIFICATE OF CORRECTION

PATENT NO. : 5,366,921

DATED : November 22, 1994

INVENTOR : KAZUAKI TASHIRO

It is certified that errors appear in the above-identified patent and that said Letters Patent is hereby corrected as shown below:

Title page, item:

[57] ABSTRACT

Line 4, "layer" should read --layers--.

COLUMN 1

Line 13, "invent ion" should read --invention--.

COLUMN 2

Line 10, "cross sectional" should read --cross-sectional--.

COLUMN 3

Line 32, "has" should be deleted; and

Line 47, "cross sectional" should read --cross-sectional--.

COLUMN 4

Line 31, " 6 a" should read --6 is a--;

Line 39, "a" should read --is a--; and

Line 55, "chargered" should read --charged--.

COLUMN 5

Line 15, "cross sectional" should read --cross-sectional--;

Line 40, "Tort." should read --Torr.--;

Line 55, "n layer 14" should read --$n^+$ layer 14--; and     Line 67, "Tort" should read --Torr--.

UNITED STATES PATENT AND TRADEMARK OFFICE
CERTIFICATE OF CORRECTION

PATENT NO. : 5,366,921

DATED : November 22, 1994

INVENTOR : KAZUAKI TASHIRO

It is certified that errors appear in the above-identified patent and that said Letters Patent is hereby corrected as shown below:

<u>COLUMN 6</u>

Line 16, "n layer." should read --$n^+$ layer.--;

Line 24, "mask. And" should read --mask, and--; and

Line 64, "thereby" should read --whereby--.

Signed and Sealed this

Eighteenth Day of April, 1995

Attest:

BRUCE LEHMAN

Attesting Officer

Commissioner of Patents and Trademarks